(12) United States Patent
Di Lello

(10) Patent No.: US 8,314,626 B2
(45) Date of Patent: Nov. 20, 2012

(54) TESTING INTEGRATED CIRCUITS ON A WAFER USING A CARTRIDGE WITH PNEUMATIC LOCKING OF THE WAFER ON A PROBE CARD

(75) Inventor: Stefano Di Lello, Spoleto (IT)

(73) Assignee: ELES Semiconductor Equipment S.p.A., Todi (IT)

( * ) Notice: Subject to any disclaimer, the term of this patent is extended or adjusted under 35 U.S.C. 154(b) by 377 days.

(21) Appl. No.: 12/527,420

(22) PCT Filed: Feb. 14, 2008

(86) PCT No.: PCT/EP2008/051790
§ 371 (c)(1),
(2), (4) Date: Feb. 12, 2010

(87) PCT Pub. No.: WO2008/098986
PCT Pub. Date: Aug. 21, 2008

(65) Prior Publication Data
US 2010/0141288 A1 Jun. 10, 2010

(30) Foreign Application Priority Data
Feb. 16, 2007 (EP) .................................. 07102587

(51) Int. Cl.
*G01R 31/20* (2006.01)
*G01R 1/067* (2006.01)
(52) U.S. Cl. .............................. 324/754.01; 324/755.01
(58) Field of Classification Search .. 324/754.01–754.3, 324/762.01–762.1, 756.03–756.07, 750.18, 324/19, 5; 257/48; 438/14–18
See application file for complete search history.

(56) References Cited

U.S. PATENT DOCUMENTS
3,596,228 A 7/1971 Reed
(Continued)

FOREIGN PATENT DOCUMENTS
EP 1959262 8/2008
(Continued)

OTHER PUBLICATIONS
European Search Report for Application No. EP07102650, European Patent Office, Berlin, Aug. 7, 2007, p. 5.
(Continued)

*Primary Examiner* — Tung X Nguyen
(74) *Attorney, Agent, or Firm* — Graybeal Jackson LLP

(57) ABSTRACT

An embodiment of a cartridge is proposed for testing integrated circuits on a wafer with the wafer that has a wafer front surface with a plurality of terminals of the integrated circuits. The cartridge includes a probe card, which has a card front surface with a plurality of probes for contacting the terminals of the integrated circuits electrically, and a card back surface opposite the card front surface. Locking means is provided for locking the wafer on the probe card. The locking means includes one or more through-holes that cross the probe card from the card front surface to the card back surface; sealing means is arranged on the card front surface around the probes and the through-holes. In this way, a substantially airtight chamber is defined by the probe card, the sealing means and the wafer when the wafer front surface abuts against the sealing means. Coupling means is arranged on the card back surface. The coupling means is used to couple the cartridge with pneumatic means for creating a depression in the chamber, by removing air from the chamber through the through-holes; the same coupling means is also used to seal the airtight chamber when the cartridge is decoupled from the pneumatic means.

19 Claims, 4 Drawing Sheets

U.S. PATENT DOCUMENTS

| | | | |
|---|---|---|---|
| 4,617,824 A | 10/1986 | Cybulski et al. | |
| 4,820,976 A | 4/1989 | Brown | |
| 5,500,605 A * | 3/1996 | Chang | 324/754.14 |
| 5,550,482 A | 8/1996 | Sano | |
| 5,604,446 A | 2/1997 | Sano | |
| 5,808,474 A | 9/1998 | Hively et al. | |
| 5,952,840 A | 9/1999 | Farnworth et al. | |
| 6,005,401 A | 12/1999 | Nakata et al. | |
| 6,163,145 A | 12/2000 | Yamada | |
| 6,204,681 B1 | 3/2001 | Nagatsuka et al. | |
| 6,233,184 B1 | 5/2001 | Barth et al. | |
| 6,317,647 B1 * | 11/2001 | Akaike et al. | 700/213 |
| 6,320,398 B1 | 11/2001 | Ito et al. | |
| 6,445,203 B1 | 9/2002 | Yamashita et al. | |
| 6,456,062 B2 | 9/2002 | Yamashita et al. | |
| 6,468,098 B1 | 10/2002 | Eldridge | |
| 6,590,381 B1 * | 7/2003 | Iino et al. | 324/750.2 |
| 6,774,661 B1 | 8/2004 | Tustaniwskyj | |
| 6,798,224 B1 | 9/2004 | Hembree et al. | |
| 7,119,531 B2 | 10/2006 | Sakata | |
| 2002/0003432 A1 | 1/2002 | Leas et al. | |
| 2002/0030501 A1 | 3/2002 | Ohtaki | |
| 2002/0093352 A1 | 7/2002 | Min et al. | |
| 2002/0197895 A1 | 12/2002 | Eldridge | |
| 2004/0019452 A1 | 1/2004 | Song et al. | |
| 2004/0056649 A1 | 3/2004 | Sherman | |
| 2004/0070416 A1 | 4/2004 | Saito et al. | |
| 2004/0164295 A1 | 8/2004 | Johnson | |
| 2005/0030007 A1 | 2/2005 | Sakata | |
| 2006/0017451 A1 | 1/2006 | Akram et al. | |
| 2007/0288823 A1 | 12/2007 | Di Stefano et al. | |
| 2008/0018353 A1 | 1/2008 | Thamarayoor | |
| 2010/0141287 A1 | 6/2010 | Scocchetti | |

FOREIGN PATENT DOCUMENTS

| | | |
|---|---|---|
| JP | 11118875 A | 4/1999 |
| WO | 0104643 | 1/2001 |
| WO | 2004008163 | 1/2004 |
| WO | 2006066620 | 6/2006 |
| WO | 2008098987 | 8/2008 |

OTHER PUBLICATIONS

International Search Report for International Application Serial No: PCT/EP2008/051790, European Patent Office, May 30, 2008.

International Search Report for International Application Serial No: PCT/EP2008/051791, European Patent Office, Oct. 7, 2008.

English Machine Translation of Foreign Doc JP 11118875A.

* cited by examiner

TESTING INTEGRATED CIRCUITS ON A WAFER USING A CARTRIDGE WITH PNEUMATIC LOCKING OF THE WAFER ON A PROBE CARD

PRIORITY CLAIM

The present application is a national phase application filed pursuant to 35 USC §371 of International Patent Application Serial No. PCT/EP2008/051790, filed Feb. 14, 2008; which further claims the benefit of European Patent Application 07102587.8, filed Feb. 16, 2007; all of the foregoing applications are incorporated herein by reference in their entireties.

RELATED APPLICATION DATA

This application is related to U.S. patent application Ser. No. 12/527,418 entitled TEST OF ELECTRONIC DEVICES AT PACKAGE LEVEL USING TEST BOARDS WITHOUT SOCKETS, filed on Aug. 14, 2009, and which is incorporated herein by reference in its entirety.

TECHNICAL FIELD

An embodiment of the present invention relates to the test field. More specifically, an embodiment of the present invention relates to the test of integrated circuits on a wafer.

BACKGROUND

Integrated circuits are generally subjected to a test process in order to verify their correct operation; this is important to ensure high quality of a manufacturing cycle of the integrated circuits. The test process may be aimed at identifying defects that are either evident or potential (i.e., which might occur after a short life of the integrated circuits). In the latter case, the integrated circuits are commonly tested under stress conditions; a typical example is the burn-in test, which consists of making the integrated circuits work for some hours at very high or very low temperature (such as ranging from −50° C. to +150° C.), in order to simulate a long period of operation of the same integrated circuits at room temperature (i.e., 25° C.-50° C.).

The test process may be performed when the integrated circuits are still on a wafer of semiconductor material (where a high number of identical integrated circuits are formed in different areas thereof). In this way, it is possible to save the costs of any next manufacturing steps (such as for the packaging) when the integrated circuits are defective; moreover, a high number of integrated circuits included in each wafer may be tested concurrently. In some cases, it is also possible to fix certain defects of the integrated circuits (so as to avoid their rejection).

Typically, the test process is implemented by means of a prober. The prober interfaces with the wafer by means of a probe card, which is provided with multiple probes for contacting corresponding terminals of the integrated circuits electrically. For this purpose, the wafer is locked on a chuck plate (for example, by means of vacuum grooves). The prober moves the chuck plate until the wafer is aligned with the probe card (so that each terminal of the integrated circuits is coupled with a corresponding probe); the prober then applies stimulus signals to the integrated circuits and receives corresponding response signals (through the probes). Particularly, availability of a full wafer probe card allows testing all the integrated circuits of the wafer at the same time. However, once the wafer has been aligned with and contacted by the (full wafer) probe card, the prober remains idle for the duration of the entire test process of the wafer (typically several hours), but at the same time completely unavailable for any other operation.

In order to solve this problem, WO-A-01/04643, which is incorporated by reference, proposes the use of a test cartridge. Particularly, the probe card is mounted in a movable manner on a corresponding plate. A mechanical system locks the chuck plate and the probe plate together (for example, by means of a pair of jaws). The position of the probe card with respect to the chuck plate (and then to the wafer) is controlled by means of a pneumatic system. For this purpose, in a proposed implementation an O-ring defines a sealed chamber between the chuck plate and the probe card; holes are formed in the probe card for controlling an air pressure in the chamber, so as to advance or retract the probe card with respect to the chuck plate. In this way, the combined actions of the mechanical system and the pneumatic system allow obtaining the desired pressure between the probe card and the wafer.

In operation, the prober aligns the wafer with the probe card and then locks them in the correct position (by means of the above-described mechanical and pneumatic systems). The cartridge is then removed from the prober so at to make it available for assembling another cartridge. A batch of cartridges so obtained is then provided to a distinct test machine. Particularly, the cartridges are placed into a burn-in chamber, and they are connected electrically to a test circuit (outside the burn-in chamber) by means of corresponding connectors arranged on the probe plates. During the test process, the temperature of the wafers is controlled by means of a heating or cooling fluid that circulates through channels formed in the chuck plates. This allows exploiting the (very expansive) mechanical section of the prober at its best—since it is used only for the assembling of the cartridges; moreover, it is now possible to test more wafers concurrently in the same test machine.

However, the structure of the cartridge disclosed in WO-A-01/04643 (and especially its mechanical system for locking the chuck plate and the probe plate together) is relatively complex and difficult to actuate. Moreover, each cartridge includes a dedicated chuck plate (required to couple the wafer with the probe card by means of the above-described mechanical and pneumatic systems); this has a detrimental effect on the cost of the cartridge.

An alternative solution is disclosed in US-A-2002/0003432, which is incorporated by reference. In this case as well, a plurality of cartridges are assembled off-line in a prober, and then provided to a distinct test machine. However, each cartridge is now obtained by locking the probe card and the wafer with a vacuum clamp. Particularly, the clamp is formed by a first mechanical member that is closed around a back surface of the probe card (opposite the one with the probes) through a first seal, and a second mechanical member that is closed around a back surface of the wafer (opposite the one with the terminals) through a second seal; the two mechanical members are coupled by means of a third seal. The clamp has a port, which is used to create the vacuum in a region defined by the probe card, the wafer and the clamp (so as to obtain the desired pressure between the probe card and the wafer). A mechanical latch (such as a wing nut) maintains the clamp tightened (even if vacuum is lost during transport of the cartridge). Springs may be associated with the probes to remove heat from a predefined internal region of the wafer where the integrated circuits are formed (thereby directing the cooling away from its peripheral region, which generates little or no heat); moreover, this structure leaves access to most of the back surface of the wafer for cooling (with the exception of the part covered by the clamp).

However, the above-described cartridge may generate unwanted bowing at an edge of the wafer; indeed, as pointed out in the same document, in order to avoid this problem the probes should extend to an edge of the probe card or the seal (between the clamp and the wafer) should extend to a last row of probes. Moreover, the structure of this cartridge remains relatively complex and difficult to actuate; particularly, its assembling requires a number of mechanical actions to mount the clamp and to tighten the latch. In any case, the solution disclosed in US-A-2002/0003432 cannot be implemented in standard probers (wherein the wafer is aligned with the probe card by acting on the chuck plate); indeed, in this case an optical alignment system based on glass reticles provided in the probe card is required.

All of the above maintains the overall cost of the test process relatively high; this drawback limits the use of the test process, and accordingly lowers the level of quality and reliability in the production of the integrated circuits.

SUMMARY

In its general terms, an embodiment of the present invention is based on the idea of coupling the wafer with the probe card directly.

More specifically, an embodiment of the invention provides a cartridge for testing integrated circuits on a wafer—with the wafer that has a wafer front surface with a plurality of terminals of the integrated circuits. The cartridge includes a probe card, which has a card front surface with a plurality of probes for contacting the terminals of the integrated circuits electrically, and a card back surface opposite the card front surface. Locking means is provided for locking the wafer on the probe card. The locking means includes one or more through-holes that cross the probe card from the card front surface to the card back surface; sealing means is arranged on the card front surface around the probes and the through-holes. In this way, a substantially airtight chamber is defined by the probe card, the sealing means and the wafer—when the wafer front surface abuts against the sealing means. Coupling means is arranged on the card back surface. The coupling means is used to couple the cartridge with pneumatic means for creating a depression in the chamber, by removing air from the chamber through the through-holes; the same coupling means is also used to seal the airtight chamber when the cartridge is decoupled from the pneumatic means.

As a further improvement, spacing means may be used to maintain a minimum distance between the wafer and the probe card.

For this purpose, a plurality of spacers (distributed substantially uniformly throughout the probes) may be provided.

A further improvement may be obtained by providing means for restoring the depression in the chamber (in response to a leakage of air into it when the cartridge is decoupled from the pneumatic means).

This result may be achieved by means of a flexible cap that defines a further chamber on the back surface of the probe card.

Moreover, it is possible to add removable protective means (such as a cap) for enclosing the wafer.

Another embodiment of the invention proposes a prober for assembling those cartridges.

A further embodiment of the invention proposes a test machine for testing the wafers included in the cartridges (wherein the wafers are conditioned thermally by acting on their exposed surfaces).

In an embodiment, this result is achieved by means of a conditioning fluid.

A further improvement may be obtained by controlling the conditioning of different areas of the exposed surfaces of the wafers selectively.

The local temperature of the exposed surfaces may be monitored so as to control their conditioning accordingly.

For example, this result may be achieved by means of an infrared camera.

In an embodiment, the conditioning fluid is supplied to different areas of the exposed surfaces of the wafers by means of corresponding nozzles (which can be driven individually).

A different embodiment of the invention proposes a corresponding method.

BRIEF DESCRIPTION OF THE DRAWINGS

One or more embodiments of the invention, as well as further features and the advantages thereof, will be best understood with reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

Figure 1:
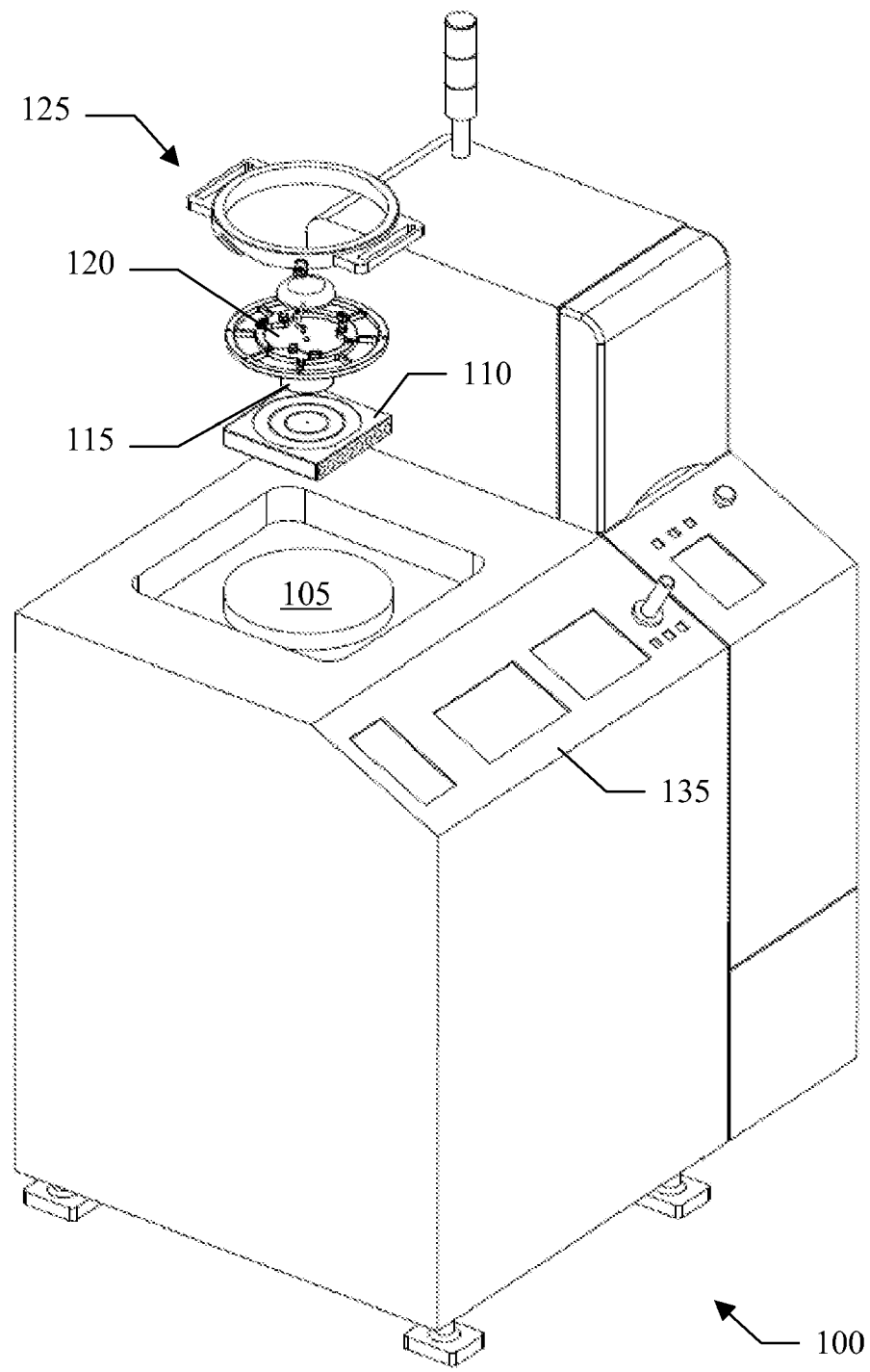
FIG. 1 is a pictorial representation of a prober that may be used to implement an embodiment of the invention.

With reference in particular to FIG. 1, a prober 100 is illustrated. The prober 100 includes an alignment station 105. The alignment station 105 is formed by a recess having a platform on its bottom, wherein a chuck plate 110 is mounted. The chuck plate 110 is used to lock a wafer of semiconductor material 115, wherein a high number of identical or substantially identical integrated circuits to be tested are formed. For this purpose, the chuck plate 110 is provided with grooves on its upper surface (where the wafer 115 is placed); those grooves are used to create the vacuum between the chuck plate 110 and the wafer 115, so as to hold the wafer 115 firmly on the chuck plate 110.

The test of the integrated circuits of the wafer 115 involves coupling it with a probe card 120, which is provided with multiple probes for contacting corresponding terminals of the integrated circuits electrically. The probe card 120 may be mounted on a cartridge 125 to facilitate its handling. The prober 100 aligns the wafer 115 with the probe card 120. Particularly, the prober 110 moves the chuck plate 115 (and then the wafer 110 held on it) laterally, until the terminals of the integrated circuits of the wafer 115 are coupled with the probes of the probe card 120. Typically, this process is carried out in two steps. At first, the wafer 115 is aligned with the probe card 120 coarsely—for example, by exploiting reference terminals of the wafer 115 (with the chuck plate 115 that is moved until dedicated probes of the probe card 120 contact the reference terminals, as detected by the receipt of a predefined response signal by the reference probes). The wafer 115 may then be aligned with the probe card 120 finely—for example, by means of optical systems (such as of the laser or infrared type).

The prober 100 is also provided with an external pneumatic system (not shown in the figure), which is used to implement the locking of the wafer 115 on the chuck plate 110; the same pneumatic system is also used to lock the wafer 115 on the probe card 120 after their alignment (as described in detail in the following). Operation of the prober 100 is controlled by means of a console 135.

Figure 2A:
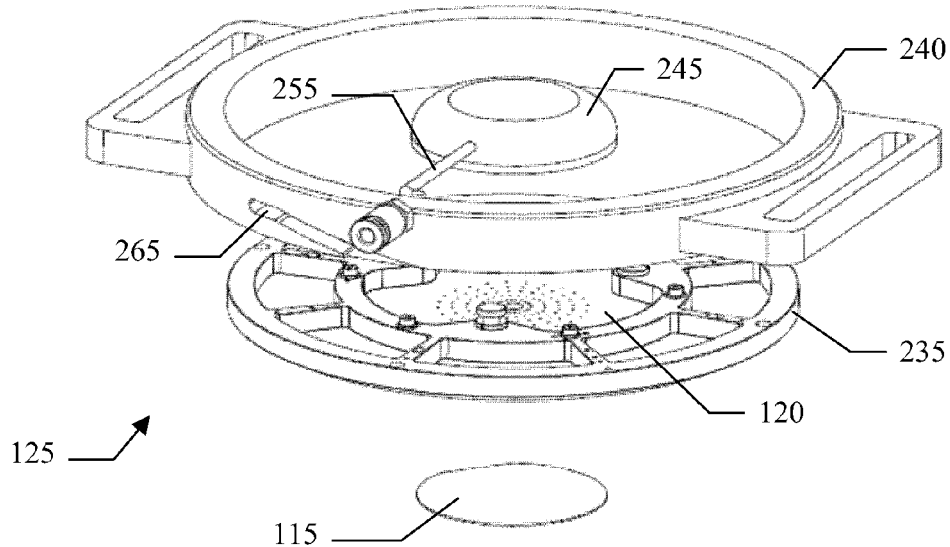
FIGS. 2A and 2B are an exploded view and a cross-sectional view, respectively, of a cartridge according to an embodiment of the invention.
Figure 2B:
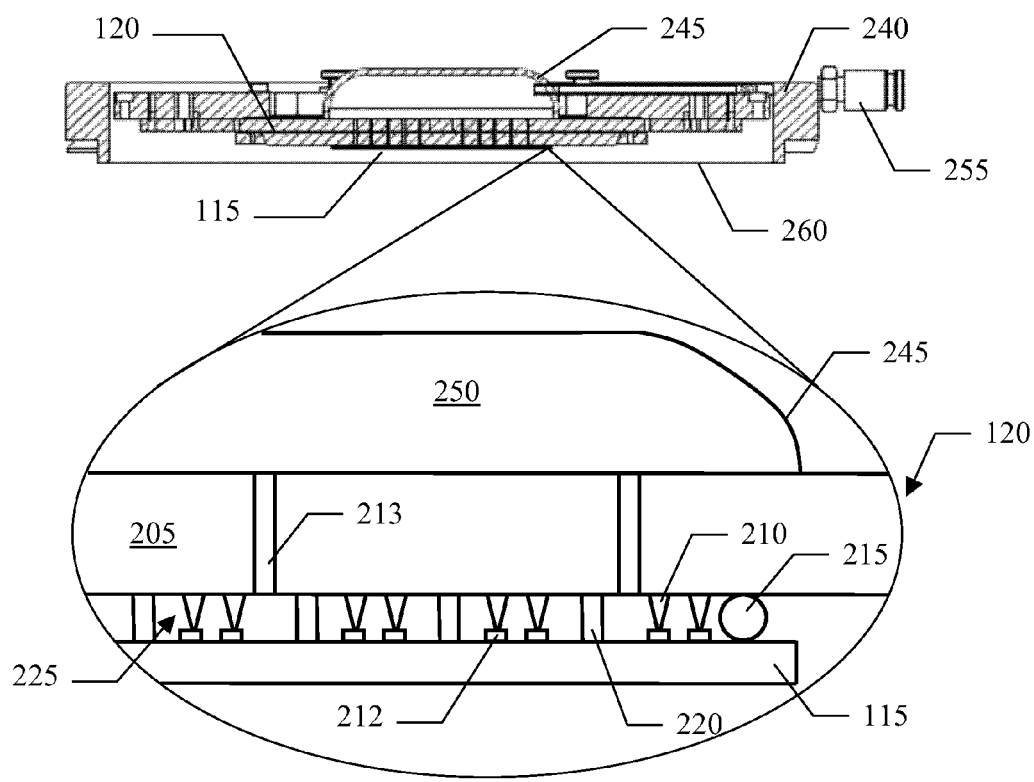

Considering now FIGS. 2A and 2B together, the probe card 120 is formed by a Printed Circuit Board (PCB) 205, which consists of an insulating substrate with (single or multiple layer) conductive tracks for routing the desired signals; typically, the insulating substrate is made of a material with a Coefficient of Thermal Expansion (CTE) similar to the one of the wafer. A high number of probes 210 (for example, from a few hundreds to several thousands) project downwards from a lower (front) surface of the board 205; when the probe card 120 is aligned and coupled with the wafer 115, the probes 210 electrically contact corresponding terminals 212 of the integrated circuits formed on an upper (front) surface of the wafer 115 (for example, consisting of pads or bumps). For this purpose, a compliant interposer (not shown in the figure) is generally provided between the board 205 and the probes 210, so as to compensate any warp of the wafer 115. Moreover, each probe 210 may be formed with an elastic core that is covered by a metal layer in the form of a pyramid (for the pads) or of a frusto-pyramid (for the bumps), as described in WO-A-2006/066620 (the entire disclosure of which is herein incorporated by reference); in this way, the probes 210 may also compensate any non-homogeneity of the terminals 212 individually.

One or more through-holes 213 cross the board 205 from its lower surface to its upper (back) surface; the through holes 213 (for example, from some tens to a few hundreds, each one with a diameter ranging from 0.1 mm to 2 mm) may be concentrated in a central area of the board 205. A seal 215 (for example, consisting of an O-ring—i.e., a toroidal element made of elastomer) is arranged on the lower surface of the board 205; the seal 215 surrounds all the probes 210 and the through holes 213 (in plant view), and it has a height (defined by a diameter of its cross-section) substantially the same as the one of the probes 210 (such as from some tens of μm to a few mm). The board 205 may also be provided with spacers 220 that project downwards from its lower surface (within the seal 215 in plant view). For example, the spacers 220 consist of some tens of pins, which are uniformly distributed throughout the probes 210; the spacers 220 have a height slightly lower than the one of the probes 210 (such as about 70-90% thereof). When the wafer 115 is placed with its upper surface abutting against the seal 215, a substantially airtight chamber 225 is formed between the probe card 120 (above), the wafer 115 (below) and the seal 215 (laterally).

The probe card 120 is mounted on a frame 235 of the cartridge 125. For example, the frame 235 includes an inner ring and an outer ring that are connected through a series of spokes; the probe card 120 is fastened to the inner ring (for example, by means of a few bolts), while the outer ring is coupled with a bearing 240. The bearing 240 in turn includes a ring matching the outer ring of the frame 235, which rings are fastened together (for example, by means of a few tap screws); the bearing 240 also includes two lateral handles, which facilitate the picking up of the cartridge 125.

A flexible cap 245 is arranged on the upper surface of the board 205 (within the inner ring of the frame 235); the flexible cap 245 encloses all the through-holes 213, so as to define a compensation chamber 250 for the airtight chamber 225. A suction duct 255 extends from the flexible cap 245 to the bearing 240; the duct 255 ends with a nipple (on the ring of the bearing 240) for coupling the compensation chamber 250—and then the airtight chamber 225—with the pneumatic system of the prober; the nipple is provided with a one-way valve that prevents any leakage of air through the duct 255 (when the nipple is decoupled from the pneumatic system).

A protective cap 260 closes the ring of the bearing 240 at its bottom, so as to enclose the wafer 115 completely. A snap fitting mechanism 265 is used to couple the protective cap 260 with the bearing 240 in a removable manner.

In operation, the cartridge 125 is placed against the wafer 115 and it is connected to the pneumatic system of the prober (through the nipple of the duct 255). The wafer 115 is then aligned with the probe card 120 as usual (by moving the chuck plate wherein it is held).

In an embodiment of the invention, once the alignment of the wafer 115 has been completed, the pneumatic system of the prober removes air from the airtight chamber 225 (through the duct 255, the compensation chamber 250 and the through-holes 213). In this way, a depression is formed in the airtight chamber 225 (and in the compensation chamber 250 as well). The difference between the (internal) pressure of the airtight chamber 225 and the (external) atmospheric pressure generates a force that presses the wafer 115 against the probe card 120, in opposition to the elastic force due of the compression of the seal 215 (with the same pressure difference that also makes the flexible cap 245 collapse against the upper surface of the board 205). More precisely, the force applied to the wafer 115 is:

$$F=(Pe-Pi)*A$$

where F is the force, Pe is the external pressure, Pi is the internal pressure, and A is the area of the wafer 115 within the airtight chamber 225. Typically, the pneumatic system of the prober controls the internal pressure of the airtight chamber 225 to obtain a force of the order of 0.5-2 kN (for example, by means of an internal pressure of about 20-80 kPa for an area of some hundreds of $cm^2$). The cartridge 125 is then disconnected from the pneumatic system of the prober (with the valve of the duct 255 that automatically seals the chambers 225 and 250). The cartridge 125 is lifted, so as to carry away the wafer 115 now fastened to the probe card 120 (being previously released from the chuck plate of the prober).

An embodiment provides an optimal locking of the wafer 115 on the probe card 120. This result is achieved in a very simple manner; particularly, the wafer 115 is locked on the probe card 120 directly, so that no additional mechanical member is required. This strongly simplifies the structure of the cartridge 125, and then its cost.

Moreover, the chuck plate 110 now remains in the prober 100. Therefore, a single chuck plate 110 may be used for whatever cartridges 125—since it is only used to lock the wafer 115 during its alignment with the probe card 120; this further contributes to reduce the cost of the cartridge 125. At the same time, the cartridge 125 leaves a lower (back) surface of the wafer 115 entirely exposed; this facilitates the control of its temperature during the test process (as it will be apparent in the following).

At the same time, the operations for assembling the cartridge 125 in the prober are strongly simplified; indeed, no mechanical action is required, apart from coupling/decoupling the cartridge 125 with the pneumatic system. Moreover, the cartridge 125 may be assembled in standard probers (wherein the wafer is aligned with the probe card by acting on the chuck plate), without requiring any special alignment system.

All of the above substantially lowers the overall cost of the test process; this fosters the widespread diffusion of the test process, and accordingly increases the level of quality and reliability in the production of the integrated circuits.

In the above-described embodiment of the invention, when the wafer 115 is pressed against the probe card 120, it abuts against the spacers 220 (after compressing the higher seal 215). The spacers 220 then maintain a minimum distance between the wafer 115 and the probe card 120, so as to avoid any damage to the probes 210. Moreover, the distribution of the spacers 220 improves the planarity of the wafer 115; this provides the correct electrical contact with the probe card 120.

Once the cartridge 125 has been removed from the prober, the protective cap 260 can be mounted on the bearing 240, so as to close the region around the wafer 115. In this way, the protective cap 260 shields the wafer 115 during its moving (before the actual test process). This prevents any damage to the wafer 115 (for example, due to atmospheric contaminations, shocks, and the like).

In this condition (with the chambers 225 and 250 that are disconnected from the pneumatic system of the prober) any leakage of air into the airtight chamber 225 would increase its internal pressure, which is not controlled by the pneumatic system any longer; for example, this leakage may be due to a non-perfect tightness of the seal 215. However, the increase of the internal pressure expands the flexible cap 245 so as to enlarge the volume of the compensation chamber 250; as a result, the internal pressure in the compensation chamber 250 decreases accordingly, thereby restoring the desired internal pressure in the airtight chamber 225 as well. This provides the application of the correct force to the wafer 115, so as to prevent any risk of loosening its coupling with the probe card 120. In should be noted that the desired result may be achieved automatically without any mechanical member; therefore, no additional mechanical action is required during the assembling of the cartridge 125.

Figure 3:
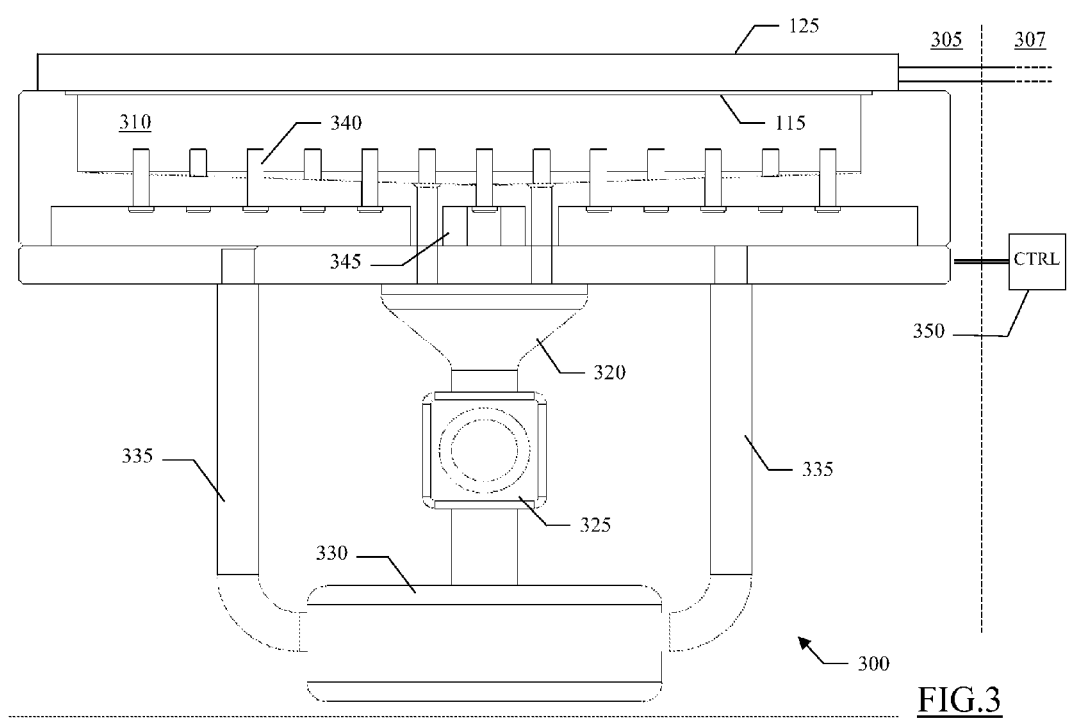
FIG. 3 is a schematic representation of a test machine wherein an embodiment of the invention can be practiced.
Figure 4:
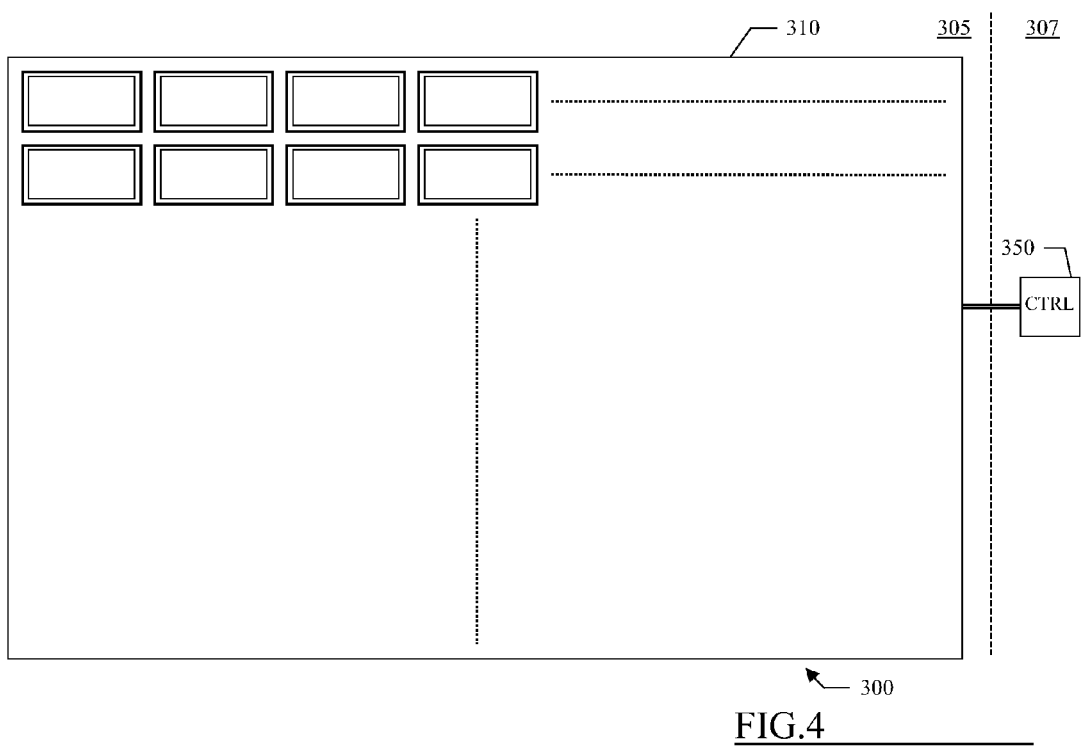
FIG. 4 is a top view of test machine wherein the solution according to an embodiment of the invention can be practiced

Moving to FIG. 3, the above-described cartridge 125 (with the wafer including the integrated circuits to be tested) is provided to a test machine 300; typically, a high number of cartridges 125 (for corresponding wafers) are assembled in succession in the prober and then provided to the same test machine 300 for their concurrent test.

For this purpose, all the cartridges 125 (only one shown in the figure) are placed into an operative region 305 of the test machine 300—after removing their protective caps. As described in detail in the following, the operative region 305 controls the temperature of the wafers in the cartridges 125 during the test process; for example, the operative region 305 is an oven, which provides the required very high or very low temperature (such as ranging from −50° C. to +150° C.) for a test process of the burn-in type. During the test process, the cartridges 125 are connected electrically to a test circuit (not shown in the figure), which provides a power supply and stimulus signals to and that receives corresponding result signals from the wafers in the cartridges 125; the test circuit is arranged in a control region 307 of the test machine 300 at room temperature (with the two regions 305 and 307 that communicate through a slot provided with an insulating seal). The cartridges 125 may also be connected to a pneumatic system (not shown in the figure) arranged in the control region 307 as well; this allows maintaining the pressure in their airtight chambers substantially constant when the cartridges 125 are warmed or cooled during the test process (even in the presence of any leakage of air).

More in detail, the operative region 305 includes a conditioning chamber 310. The conditioning chamber 310 has a top cover with a matrix of windows. Each window is formed by an opening with a seal arranged around it above the cover, which opening has a size comprised between the one of the probe card and the one of the wafer of each cartridge. In this way, when the cartridge 125 is placed on the cover and fastened to it (for example, by means of a clamp not shown in the figure), the probe card is pressed against the seal so as to close the window; at the same time, the wafer directly faces the conditioning chamber 310 through the window.

An inlet conduit 320 (for example, consisting of a series of intakes ending into a funnel) connects the conditioning chamber 310 to a pump 325. The pump 325 removes water from the conditioning chamber 310 and forces it towards a heat exchanger 330. The heat exchanger 330 warms or cools the water according to the temperature that is desired in the conditioning chamber 310. An outlet conduit 335 connects the heat exchanger 330 to a plurality of nozzles 340, which open in the conditioning chamber 310 (for example, some hundreds facing upwards and being uniformly distributed). In this way, the heat exchanger 330 returns the warmed/cooled water to the conditioning chamber 310.

An infrared camera 345 monitors the local temperature of the wafers in the cartridges 125. For this purpose, the camera 345 takes a snapshot (from below) of the cover of the conditioning chamber 310 periodically (for example, every 30-120 s); this snapshot then provides a temperature map of the exposed surfaces of the wafers in the cartridges 125 facing the conditioning chamber 310 (through its windows).

A controller 350 (in the control region 307) manages operation of the whole test machine 300. Particularly, the controller 350 receives the temperature map from the camera 345; moreover, the controller 350 drives the heat exchanger 330 and it regulates the flow of water for each nozzle 340 individually (setting it between completely open and completely close).

During the test process, the water continuously flows through the circuit defined by the inlet conduit 320, the pump 325, the heat exchanger 330, the outlet conduit 335, and the nozzles 340. As a result, the water in the conditioning chamber 310 is maintained at the desired temperature, so as to warm or cool the wafers in the cartridges 125 accordingly.

The proposed structure allows controlling the temperature of the wafers in the cartridges 125 in a very effective way (since the warm/cool water now acts on the exposed surfaces of the wafers in the cartridges 125 directly); therefore, it is possible to improve the uniformity of the temperature of the integrated circuits under test. Moreover, the terminals of the wafers are sealed into the airtight chambers of the corresponding cartridges, while their probe cards remain outside the conditioning chamber 210 (and then they are not reached by the water); in this way, it is possible to use the water (or any other conductive liquid) to warm/cool the wafers without any insulation problems.

At the same time, the temperature map taken by the camera 345 provides an accurate representation of the actual distribution of the local temperature throughout the wafers in the cartridges 125. The controller 350 drives the nozzles 340 accordingly; particularly, the nozzles 340 facing a too cold area are open while the nozzles 340 facing a too warm area are closed—when the wafers in the cartridges 125 are to be warmed (or vice-versa when they are to be cooled). In this way, it is possible to regulate the temperature of the wafers in the cartridges 125 dynamically in a selective way; for example, this allows reducing the warming of an area including power components (which already dissipate a high amount of heat by themselves), or to cool an area including a defective component (causing an anomalous local warming). All of the above makes it possible to obtain a substantially uniform distribution of the temperature throughout the integrated circuits under test in substantially any condition.

Naturally, in order to satisfy local and specific requirements, a person skilled in the art may apply to the solution described above many logical and/or physical modifications and alterations. More specifically, although one or more embodiments of the present invention have been described with a certain degree of particularity, it should be understood that various omissions, substitutions and changes in the form and details as well as other embodiments are possible. Particularly, an embodiment may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

For example, similar considerations apply if the cartridge has a different structure or includes equivalent components; for example, the probe card may be mounted on a similar frame and/or bearing (or it may even be left free), the probes may be of other types (such as based on cantilever blades or micro-springs), and the like. Moreover, it is emphasized that an embodiment may be applied to MEMS structures, to optical devices, or more generally to any type of circuits integrated on a generic wafer.

Alternatively, the through-holes crossing the probe card may be in a different number and/or they may have a different section. Moreover, it is possible to replace the O-ring with an equivalent seal (for example, with a different shape and/or section—even arranged on the wafer instead of on the probe card), or to couple the cartridge with the pneumatic system of the prober in another way.

In a different embodiment, the spacers are implemented with equivalent elements (such as small balls).

Moreover, nothing prevents arranging them in a different way; in any case, an implementation without any spacers is possible (especially for very small wafers).

Alternatively, the compensation chamber may be implemented with a piston that is biased by a spring, or with other similar mechanisms.

In any case, this feature is not strictly necessary and it may be omitted in a simplified implementation.

It is also possible to protect the wafer (once the cartridge has been assembled) with any other device (for example, based on an a pivoting cap); however, nothing prevents leaving the wafer always exposed (without any protection).

Similar considerations apply if the prober has a different structure or includes equivalent components; for example, the chuck plate may be of an equivalent type (such has capable of locking the wafer temporarily with an electromagnetic or mechanical action), the probe card may be aligned with the wafer by means of another procedure (even in a single step), and the like. In any case, the assembling of the proposed cartridge in a prober with a non-standard alignment system is contemplated.

Likewise, the cartridges may be used in a similar test machine; for example, it is possible to have more conditioning chambers, to open the windows in a generic covering thereof (even laterally and/on on its bottom), to work at different temperatures, and so on. Moreover, although the devised solution has been specifically designed for a test process of the burn-in type, this is not to be interpreted in a limitative manner, with the same solution that is also suitable to be used in different test processes (for example, of the functional type). In any case, nothing prevents the use of the proposed cartridge in standard test machines (for example, with a rack structure for housing the cartridges).

Alternatively, a different fluid (for example, air or nitrogen) may be used to condition the wafers thermally (either to warm or to cool them). Nevertheless, the use of any other system capable of acting directly on the exposed surfaces of the wafers is within the scope of this disclosure; for example, a different implementation of the test machine may be based on an infrared lamp, on a laser, or on any equivalent heating source.

The above-described selective control of the temperature of different areas of the wafers may also be implemented with other techniques; for example, it is possible to have a (static) shielding mask interposed between the heating source and the wafers.

Similar considerations apply if the local temperature is controlled in a different way; for example, it is possible to measure the local temperature continuously, to update the conditioning of the wafers only when predefined threshold temperatures are reached, to filter sharp changes of the local temperature, and the like.

Without departing from the principles of the disclosure, the local temperature may be monitored with sensors arranged on the probe cards, or with any other equivalent means.

In a different embodiment of the invention, it is possible to have a glass sheet with a printed mask (arranged between the heating source and the wafers). A roll is used to delete the mask, while an inkjet head is used to print a new mask, with a pattern based on the measured local temperature of the wafers—for example, with dots that span from completely dark to completely opaque (with a scale of gray levels therebetween).

At the end, the proposed solution lends itself to be implemented with an equivalent method (by using similar steps, removing some steps non-essential steps, or adding further optional steps); moreover, the steps may be performed in a different order, concurrently or in an interleaved way (at least in part).

The invention claimed is:

1. A cartridge for testing integrated circuits on a wafer, the wafer having a wafer front surface with a plurality of terminals of the integrated circuits, wherein the cartridge includes a probe card having a card front surface with a plurality of probes for contacting the terminals of the integrated circuits electrically and a card back surface opposite the card front surface, and locking means for locking the wafer on the probe card, the locking means including at least one through-hole crossing the probe card from the card front surface to the card back surface, sealing means arranged on the card front surface around the probes and the at least one through-hole, a substantially airtight chamber being defined by the probe card, the sealing means and the wafer when the wafer front surface abuts against the sealing means, and coupling means arranged on the card back surface for coupling the cartridge with pneumatic means for creating a depression in the chamber by removing air from the chamber through the at least one through-hole and for sealing the airtight chamber when the cartridge is decoupled from the pneumatic means.

2. The cartridge according to claim 1, wherein the probe card further includes spacing means projecting from the card front surface for maintaining a minimum distance between the probe card and the wafer.

3. The cartridge according to claim 2, wherein the spacing means includes a plurality of spacers being distributed substantially uniformly throughout the probes.

4. The cartridge according to claim 2, wherein the coupling means further includes compensating means for restoring the depression in the chamber in response to a leakage of air into the chamber when the cartridge is decoupled from the pneumatic means.

5. The cartridge according to claim 3, wherein the coupling means further includes compensating means for restoring the depression in the chamber in response to a leakage of air into the chamber when the cartridge is decoupled from the pneumatic means.

6. The cartridge according to claim 1, wherein the coupling means further includes compensating means for restoring the depression in the chamber in response to a leakage of air into the chamber when the cartridge is decoupled from the pneumatic means.

7. The cartridge according to claim 6, wherein the compensating means includes a flexible cap arranged on the card back surface around the at least one through-hole to define a further chamber, the further chamber collapsing in response to the removal of the air from the chamber and expanding in response to the leakage of the air into the chamber.

8. The cartridge according to claim 1, further including protective means for enclosing the wafer when coupled with the probe card, and means for mounting the protective means in a removable manner.

9. A prober for assembling a plurality of cartridges according to claim 1 to be supplied to a test machine, the prober including a chuck plate for locking the wafer during the assembling and for releasing the wafer after the assembling, means for aligning the wafer with the probe card by moving the chuck plate locking the wafer, and the pneumatic means for creating the depression in the chamber.

10. A test machine for testing a plurality of cartridges according to claim 1, the test machine including at least one conditioning chamber having a covering with a plurality of windows each one adapted to be closed by the probe card of a corresponding one of the cartridges, a wafer back surface opposite the wafer front surface of the wafer of the cartridge facing the conditioning chamber through the window, conditioning means for conditioning each wafer thermally by acting on the wafer back surface thereof, and means for testing each wafer.

11. The test machine according to claim 10, wherein the conditioning means includes means for controlling a temperature of a conditioning fluid, and means for supplying the conditioning fluid to the wafer back surface of each wafer.

12. The test machine according to claim 11, further including control means for controlling the conditioning means to act selectively on different areas of the wafer back surface of each wafer.

13. The test machine according to claim 12, wherein the means for supplying the conditioning fluid includes a plurality of nozzles each one for a corresponding area of the wafer back surface of each wafer, the actuation means including means for driving each nozzle individually.

14. The test machine according to claim 10, further including control means for controlling the conditioning means to act selectively on different areas of the wafer back surface of each wafer.

15. The test machine according to claim 14, wherein the control means includes monitoring means for monitoring a local temperature of the wafer back surface of each wafer, and actuation means for actuating the conditioning means according to the local temperature.

16. The test machine according to claim 15, wherein the monitoring means includes an infrared camera for taking a snapshot of the wafer back surface of each wafer, the snapshot providing an indication of the local temperature of the wafer back surface of each wafer.

17. A method for testing integrated circuits on a wafer by means of a cartridge, the wafer having a wafer front surface with a plurality of terminals of the integrated circuits, wherein the method includes the steps of:
    providing a probe card having a card front surface with a plurality of probes for contacting the terminals of the integrated circuits electrically and a card back surface opposite the card front surface, and
    locking the wafer on the probe card,
    wherein the step of locking includes:
    placing the wafer with the wafer front surface abutting against sealing means arranged on the card front surface around the probes and at least one through-hole crossing the probe card from the card front surface to the card back surface, a substantially airtight chamber being defined by the probe card, the sealing means and the wafer,
    coupling the cartridge by means for coupling means arranged on the card back surface with pneumatic means for creating a depression in the chamber by removing air from the chamber through the at least one through-hole, and
    decoupling the cartridge from the pneumatic means, the coupling means sealing the airtight chamber when the cartridge is decoupled from the pneumatic means.

18. The method according to claim 17, further including the steps of:
    assembling a plurality of cartridges in a prober, for each cartridge the step of assembling including:
    locking the wafer on a chuck plate,
    aligning the wafer with the probe card by moving the chuck plate locking the wafer,
    creating the depression in the chamber,
    releasing the wafer from the chuck plate, and
    supplying the cartridges to a test machine.

19. The method according to claim 17, further including the steps of:
    closing each one of a plurality of windows being opened in a covering of at least one conditioning chamber of the test machine by the probe card of a corresponding one of the cartridges, a wafer back surface opposite the wafer front surface of the wafer of the cartridge facing the conditioning chamber through the window,
    conditioning each wafer thermally by acting on the wafer back surface thereof, and
    testing each wafer.

* * * * *